United States Patent
Ku et al.

(10) Patent No.: US 6,422,246 B1
(45) Date of Patent: Jul. 23, 2002

(54) METHOD REMOVING RESIDUAL PHOTORESIST

(75) Inventors: Chi-Fa Ku, Hsinchu Hsien; Hsiao-Pang Chou, Taipei Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/515,952

(22) Filed: Feb. 29, 2000

(51) Int. Cl.$^7$ .................................................. B08B 9/00
(52) U.S. Cl. ............................ 134/1.2; 134/1.3; 134/2; 510/175
(58) Field of Search ............................. 134/1.2, 1.3, 2, 134/34, 22.19; 510/175; 156/2, 659.11; 430/270.1

(56) References Cited

U.S. PATENT DOCUMENTS

| | | | |
|---|---|---|---|
| 3,871,929 A | * 3/1975 | Schevey et al. ............... | 156/2 |
| 4,304,681 A | * 12/1981 | Martin et al. ................ | 252/143 |
| 4,850,381 A | * 7/1989 | Moe et al. .................... | 134/62 |
| 4,934,391 A | * 6/1990 | Futch et al. .................. | 134/40 |
| 5,567,271 A | * 10/1996 | Chu et al. .............. | 156/659.11 |
| 5,674,357 A | * 10/1997 | Sun et al. .............. | 156/659.11 |
| 6,105,588 A | * 8/2000 | Li et al. ...................... | 134/1.1 |
| 6,153,018 A | * 11/2000 | Rotondaro et al. ........... | 134/27 |

\* cited by examiner

*Primary Examiner*—Randy Gulakowski
*Assistant Examiner*—Gentle Winter
(74) *Attorney, Agent, or Firm*—J.C. Patents

(57) ABSTRACT

A method for removing residual color photoresist material from a substrate after photoresist development. The method washes the substrate with a high-pressure jet of de-ionized water that contains an activated interface agent. A second method of removing the residual photoresist material bombards the substrate with oxygen plasma for a brief period so that the residual photoresist material is polarized and then rinses the substrate with de-ionized water.

4 Claims, 3 Drawing Sheets

METHOD REMOVING RESIDUAL PHOTORESIST

BACKGROUND OF THE INVENTION

1. Field of the Invention

The present invention relates to a method of removing any residual photoresist that remains after photoresist development. More particularly, the present invention relates to a method of removing residual color photoresist from a developed color photoresist layer often used as an image sensor.

2. Description of the Related Art

A digital color image is normally formed by shining a beam of light through a stack of color filter arrays (CFA) so that the image is intercepted by a charge coupled device (CCD) or a CMOS image sensor. In general, a CFA consists of three or more color filtering channels alternately positioned such that each color filter channel permits only a designated frequency bandwidth in the visible light spectrum to pass to an image sensor. Hence, color content of a photographic image is determined by various elements in the CFA. Typical color elements used in a CFA includes red, green, blue (RGB) or cyan, magenta, yellow (CMY) or some other assembly of colors.

FIG. 1 is a schematic cross-sectional view showing a RGB color photoresist layer 12 formed over a CMOS transistor substrate 10 in the process of forming the image sensor of a CFA. In general, the photoresist layer is formed on a rough substrate surface. Since the photoresist layer is neither smooth nor uniform in thickness, diffused light is often produced in the process of transferring a pattern to the photoresist layer, resulting in some residual photoresist material 14 in the supposedly blank region 20. Another source that may contribute to the appearance of photoresist material 14 inside the blank region 20 is an improper setting of baking temperature or duration. The resulting residual photoresist material is very difficult to remove by conventional cleaning processes. However, if the residual photoresist is not removed from the blank area 20, product quality is likely to be affected.

SUMMARY OF THE INVENTION

Accordingly, one object of the present invention is to provide a method capable of removing residual color photoresist without affecting the color photoresist pattern.

To achieve these and other advantages and in accordance with the purpose of the invention, as embodied and broadly described herein, the invention provides a method of removing any residual color photoresist that remains on a substrate after a patterned color photoresist layer is formed over the substrate. The method includes aiming a high-pressure jet of de-ionized water that contains an interface-activating agent at the substrate.

The invention also provides a second method of removing any residual color photoresist that remains on a substrate after a patterned color photoresist layer is formed over the substrate. The method includes aiming oxygen plasma at the substrate so that the residual photoresist material is polarized. The polarized residual photoresist material is next removed by de-ionized water.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
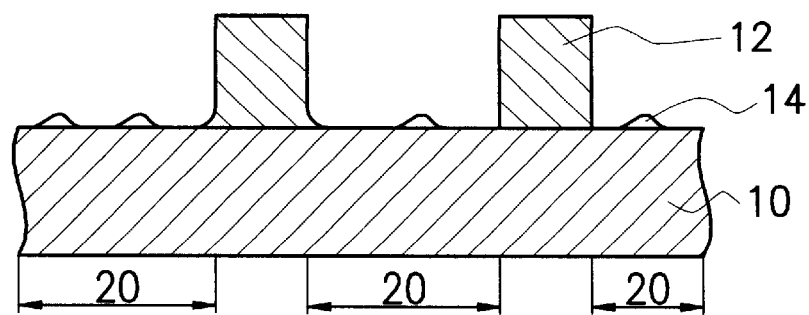
FIG. 1 is a schematic cross-sectional view showing a RGB color photoresist layer formed over a CMOS transistor substrate in the process of forming the image sensor of a CFA.

Reference will now be made in detail to the present preferred embodiments of the invention, examples of which are illustrated in the accompanying drawings. Wherever possible, the same reference numbers are used in the drawings and the description to refer to the same or like parts.

The method of removing residual photoresist from the exposed surface of a substrate is explained in two embodiments. In the first embodiment of this invention, a high-pressure jet of de-ionized water that contains an activated interface agent is targeted at the substrate. In the second embodiment of this invention, the residual photoresist material on the substrate is first polarized through bombarding the substrate with oxygen plasma, and then the polarized residual photoresist is washed away by de-ionized water.

Figure 2A:
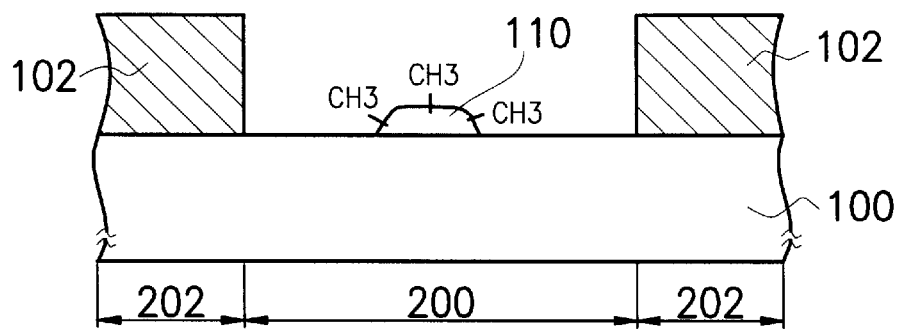
FIGS. 2A through 2C are schematic cross-sectional views showing the steps for removing residual color photoresist from a substrate according to a first preferred embodiment of this invention.
Figure 2B:
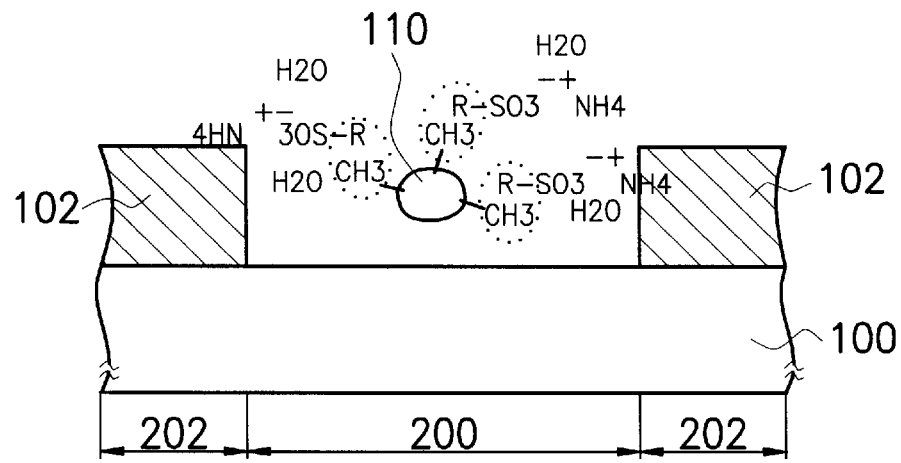
Figure 2C:
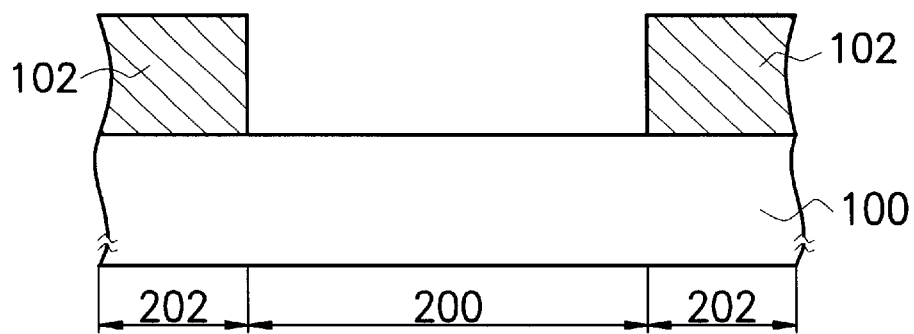

FIGS. 2A through 2C are schematic cross-sectional views showing the steps for removing residual color photoresist from a substrate according to a first preferred embodiment of this invention. First, as shown in FIG. 2A, a substrate 100 is provided. The substrate 100 already has CMOS transistors (not shown) formed thereon from previous processing steps. A color photoresist layer 102 is formed over the substrate 100. The color photoresist layer 102 can be pigmented acrylate or dyed photoresist such as Novolac; resin or dyed polyimide, for example. In general, a negative photoresist material is used to form the color photoresist layer 102.

Using conventional photolithographic techniques, the photoresist layer 102 is first exposed to light followed by chemical development of the exposed photoresist so that a pattern is formed in the pattern region 202. Due to the presence of CMOS transistors on the substrate 100, the upper surface is likely to be uneven, leading to a local diffusion of light in photolithographic operation. Hence, some residual photoresist material 110 may remain on top of supposedly blank region 200 after chemical development of the photoresist layer. In addition, the improper setting of baking temperature and duration may also lead to the deposition of residual photoresist material 110 in the blank region 200 of the substrate 100.

Since color photoresist is a high-molecular weight polymer, the residual photoresist 110 on the substrate 100 is composed of high-molecular weight polymer, too. In general, high-molecular weight polymer is normally non-polar and has alkyl radicals close to the surface. Hence, the residual photoresist 110 can be represented by a bulk material with many methyl functional groups ($—CH_3$) attached to the surface.

As shown in FIG. 2B, a jet of high-pressure de-ionized water containing an activated interface agent is targeted at the substrate 100. The activated interface agent includes for example, compounds containing an ammonium sulfonate. Further, the activated interface agent can be represented by a molecular formula R—$SO_3NH_4$. Examples of commercially available products such as Tergital or Teryitox that contain compound(s) having ammonium sulfonate group may also be used as an activated interface agent. When the jet of high pressure de-ionized water containing the said activated interface agent is sprayed on the substrate 100 having the residual photoresist 110, the non-polar end —R of the activated interface agent will react with the non-polar end of the residual photoresist material 110, as a result the photoresist material 110 dissolved into small bits. Further, due to the intrinsic polar property of de-ionized water and the erosive power of the high-pressure water jet, the activated interface agent and residual photoresist material 110 are pulled away as soon as they react.

As shown in FIG. 2C, residual photoresist 110 is completely removed from the blank region 200 through reaction with the activated interface agent and pressure of the water jet. Consequently, no other regions except the pattern region 202 contains the color photoresist layer 102.

FIGS. 3A through 3D are schematic cross-sectional views showing the steps for removing residual color photoresist from a substrate according to a second preferred embodiment of this invention.

Figure 3A:
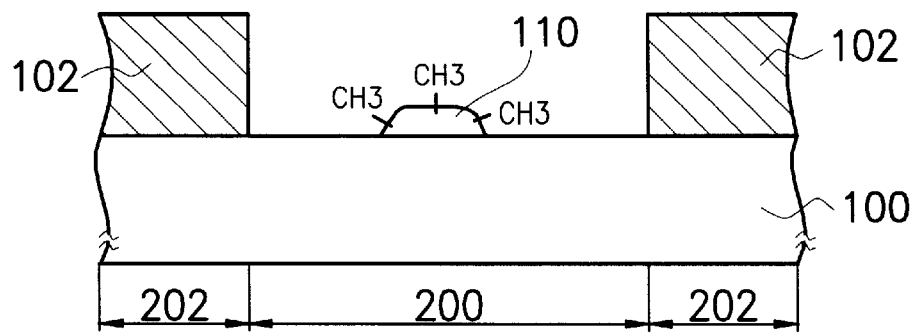
FIGS. 3A through 3D are schematic cross-sectional views showing the steps for removing residual color photoresist from a substrate according to a second preferred embodiment of this invention.

First, as shown in FIG. 3A, a substrate 100 is provided. The substrate 100 already has CMOS transistors (not shown) formed thereon in previous processing steps. A color photoresist layer 102 is formed over the substrate 100 in a manner similar to the process described in the first embodiment.

Using conventional photolithographic techniques, the photoresist layer 102 is first exposed to light followed by chemical development of the exposed photoresist so that a pattern is formed in the pattern region 202. Due to diffused light during photolithographic operation or improper baking temperature or duration, some residual photoresist material 110 is formed on top of supposedly blank region 200 after chemical development of the photoresist layer. The residual photoresist 110 on the substrate 100 is composed of high-molecular weight polymer. In general, high-molecular weight polymer is normally non-polar having alkyl radicals close to the surface. Hence, the residual photoresist 110 can be represented by a bulk material with many methyl functional groups (—$CH_3$) attached to the surface.

Figure 3B:
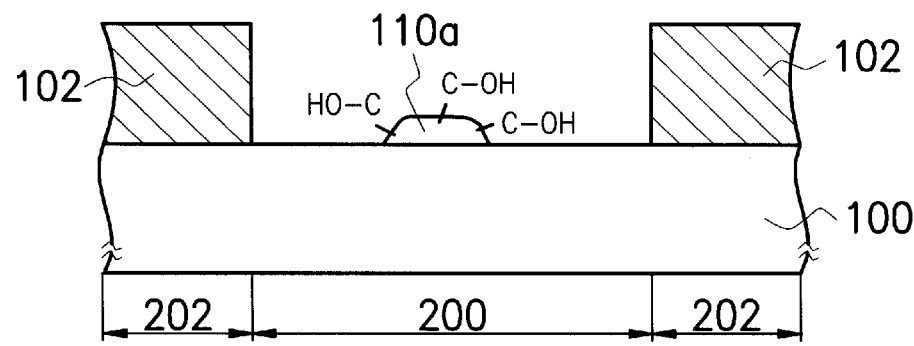

As shown in FIG. 3B, the residual photoresist material 110 is polarized by aiming oxygen plasma at the substrate 100 for a few seconds. In the presence of oxygen plasma, the —$CH_3$ bonds near the surface of the residual photoresist material 110 are transformed into C—OH bonds. Hence, the surface of the residual photoresist material 110 is converted into a polar material 110a. In other words, the hydrophobic residual photoresist material 110 is transformed into a hydrophilic substance 110a. Furthermore, since oxygen plasma is applied to the substrate 100 only for a very short period, the bulk of the color photoresist layer 102 is unaffected.

Figure 3C:
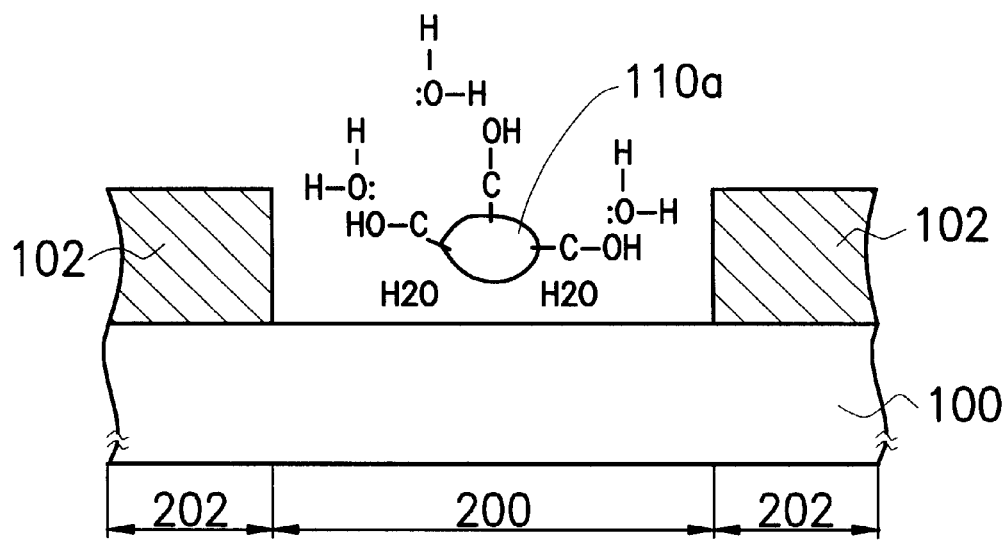

As shown in FIG. 3C, the polarized residual photoresist material 110a is removed by washing the substrate 100 with de-ionized water. Since de-ionized water is slightly polar, the polarized photoresist material 110a is able to dissolve and then be washed away by the water.

Figure 3D:
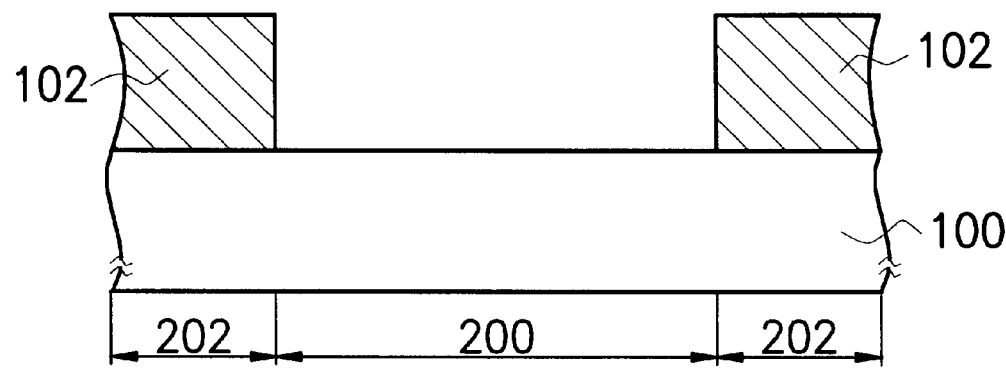

As shown in FIG. 3D, residual photoresist 110 is completely removed from the blank region 200 through reaction with the activated interface agent and pressure of the water jet. Consequently, only the pattern region 202 contains the color photoresist layer 102.

In summary, this invention provides an effective method of removing residual photoresist material on the blank region of a substrate without damaging the color photoresist layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for removing residual photoresist material on a transistor substrate after development of a patterned color photoresist layer, comprising the steps of:

aiming a high-pressure jet of de-ionized water that contains an activated interface agent at the substrate to remove the residual photoresist material so that the patterned color photoresist layer is substantially free of residual photoresistmaterial.

2. The method of claim 1, wherein the activated interface agent includes an ammonium sulfonate.

3. The method of claim 1, wherein the activated agent includes compounds having a molecular formula R—$SO_3NH_4$.

4. A method of forming a photoresist pattern over a transistor substrate, the substrate comprising at least a color photoresist layer, the method comprising the steps of:

exposing the color photoresist layer to a radiation;

removing at least a portion of the color photoresist layer after the exposure step to expose a portion of the substrate to form a patterned color photoresist layer, wherein a residual color photoresist material remains over the exposed portion of the substrate; and aiming a high-pressure jet of de-ionized water that contains an activated interface agent at the substrate to remove the residual color photoresist material.

* * * * *